(12) United States Patent
Starodoumov et al.

(10) Patent No.: US 8,873,136 B2
(45) Date of Patent: Oct. 28, 2014

(54) HIGH-GAIN FACE-PUMPED SLAB-AMPLIFIER

(71) Applicant: Coherent, Inc., Santa Clara, CA (US)

(72) Inventors: Andrei Starodoumov, Campbell, CA (US); Norman Hodgson, Belmont, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 13/753,738

(22) Filed: Jan. 30, 2013

(65) Prior Publication Data

US 2014/0211301 A1  Jul. 31, 2014

(51) Int. Cl.
*H01S 3/0941* (2006.01)
*H01S 3/16* (2006.01)

(52) U.S. Cl.
USPC ............................................. 359/342; 372/70

(58) Field of Classification Search
USPC .............................. 359/333, 342; 372/70, 72
See application file for complete search history.

(56) References Cited

U.S. PATENT DOCUMENTS

| | | | |
|---|---|---|---|
| 5,315,612 A | 5/1994 | Alcock et al. | |
| 6,418,156 B1* | 7/2002 | Peressini | 372/66 |
| 7,256,931 B2 | 8/2007 | Damzen | |
| 7,606,283 B2* | 10/2009 | Jennings et al. | 372/70 |
| 2002/0114372 A1* | 8/2002 | Montagne | 372/75 |
| 2010/0215067 A1 | 8/2010 | Ripin et al. | |
| 2011/0249698 A1 | 10/2011 | Hertwig et al. | |
| 2012/0217375 A1 | 8/2012 | Lin | |
| 2012/0250719 A1 | 10/2012 | Hodgson et al. | |
| 2013/0044768 A1* | 2/2013 | Ter-Mikirtychev | 372/5 |

FOREIGN PATENT DOCUMENTS

| | | |
|---|---|---|
| DE | 102011075274 A1 | 11/2012 |
| EP | 1204182 A2 | 5/2002 |

OTHER PUBLICATIONS

Hodgson et al., "Diode-Pumped, 220w Ultra-Thin Slab Nd:YAG Laser with Near-Diffraction Limited Beam Quality", Optical Society of America, vol. 68, 2002, pp. 552-557.
Lee et al., "High-Average-Power Nd:YAG Planar Waveguide Laser that is Face Pumped by 10 Laser Diode Bars", Optics Letters, vol. 27, No. 7, Apr. 1, 2002, pp. 524-526.
Russbueldt et al., "400W Yb:YAG Innoslab Fs-Amplifier", Optics Express, vol. 17, No. 15, Jul. 20, 2009, pp. 12230-12245.
Sueda et al., "High-Power and High-Efficiency LD Pumped Yb:YAG Micro-Thickness Slab Laser", Optical Society of America, MB15, 2004, 3 pages.
International Search Report and Written Opinion received for PCT Patent Application No. PCT/US2014/013445, mailed on Apr. 22, 2014, 13 pages.

* cited by examiner

*Primary Examiner* — Mark Hellner
(74) *Attorney, Agent, or Firm* — Morrison & Foerster LLP

(57) ABSTRACT

An optical amplifier for use as a final amplification stage for a fiber-MOPA has a gain-element including a thin wafer or chip of ytterbium-doped YAG. An elongated gain-region is formed in gain-element by multiple incidences of radiation from a diode-laser bar.

19 Claims, 7 Drawing Sheets

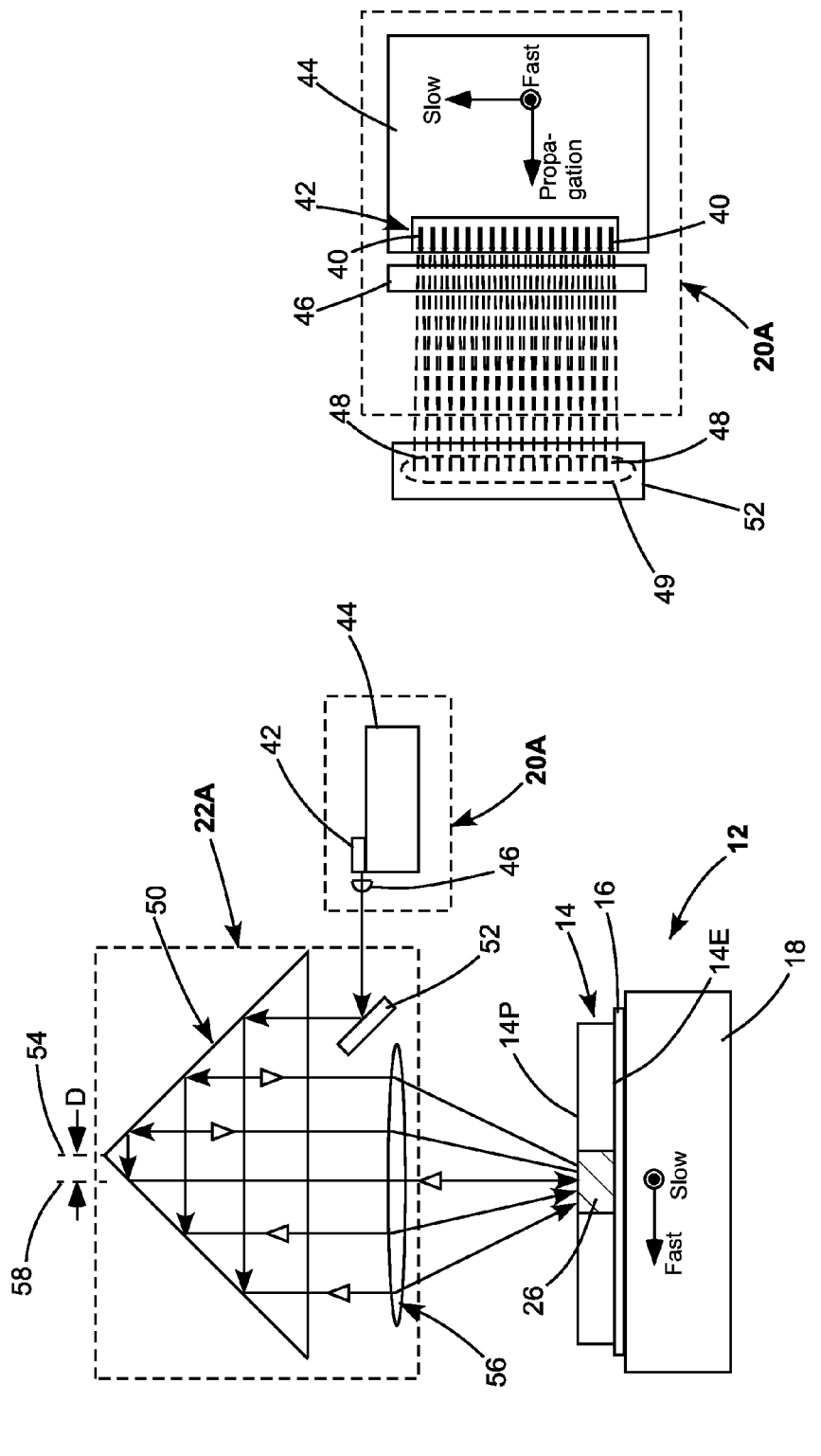

HIGH-GAIN FACE-PUMPED SLAB-AMPLIFIER

TECHNICAL FIELD OF THE INVENTION

The present invention relates in general to laser master-oscillator power-amplifier (MOPA) systems. The invention relates in particular to fiber MOPA systems providing very short output pulses, for example, pulses of about 500 picoseconds (ps) or less duration.

DISCUSSION OF BACKGROUND ART

Commercially practical fiber-MOPA systems are now capable of delivering pulsed output with pulses having a duration as short as one picosecond or even a few hundred femtoseconds (fs). A common configuration of such a fiber-MOPA includes a mode-locked fiber-laser delivering a train of seed-pulses having the desired pulse-duration at a repetition rate in the tens of megahertz (MHz); optionally, one or more stages of fiber-amplification for initially amplifying the pulses; a device for stretching the duration of the pulses; a modulator or "pulse-picker" for selecting amplified pulses from the train for further amplification; one or more stages of fiber-amplification for power amplification; and a pulse compressing device for returning the duration of the power-amplified pulses to about the duration of the seed-pulses. Fiber-amplifiers offer high-gain and efficiency, and, for the most part, are easily packaged.

In fiber-MOPAs delivering such pulses with an average power on the order of 10 or more Watts (W), final fiber-amplifier stages typically include a rod-fiber or so-called photonic-crystal fiber (PCF). These fibers are expensive and can contribute as much as 25% to the total cost of a fiber MOPA. Further such fibers are subject to degradation through photo-darkening and require sophisticated packaging and cooling techniques to avoid thermal issues and pump-induced stresses that lead to modal instabilities and fiber damage.

It has been proposed to use one or more bulk solid-state amplification stages, either in a multiple-pass configuration or in form of a regenerative amplification scheme, in place of rod fibers or PCFs. These bulk amplifiers which include end-pumped rods, face-pumped disks, or side-pumped slabs, however, are relatively low in gain, and inefficient compared with fiber-amplifiers, and, accordingly, would require more powerful and more complex pump arrangements and beam handling arrangements, more powerful seed lasers, besides simply adding volume and cost to the MOPA.

End-pumped Yb-doped rod amplifiers, for instance, require very high brightness pump light and are output power limited to about 10 W due to strong thermal lensing and high temperature in the gain material. Yb-doped disk amplifiers operate at low temperature, due to the large cooling surface, and can be pumped at power levels of up to several kW. However, they exhibit very low gain factors of between about 1.1 and 1.3 per seed-beam interaction, requiring up to 150 interactions (bounces) in a regenerative amplifier to amplify a milliwatt level seed beam to several tens of Watts.

Side and end-pumped Yb-doped slab amplifiers have been proposed as an alternative. However, due to Yb being a quasi 3-level system, a high pump intensity (on the order of about $10 kW/cm^2$) is required to generate gain over a 10 mm long, 10 mm wide and 200 um thick pump region. This means that pump powers in excess of 150 W are required just to make the slab transparent, making this geometry only efficient and cost-effective for high-power multi-pass amplifiers with several 100 W of output power. In addition, the requirement of very high brightness of the pump light in one direction leads to very complex and expensive beam trains for the pump light.

There is a need for an alternate replacement for rod and PCF fibers in a fiber MOPA. The replacement preferably retains the high-gain, efficiency, and ease of packaging offered by fiber-amplification.

SUMMARY OF THE INVENTION

In one aspect an optical amplifier for amplifying optical pulses, comprises a gain-element in the form of a slab of a solid-state gain-medium having first and second opposite faces, first and second opposite ends, and first and second opposite sides. The gain-medium is selected from a group of gain-media consisting of thulium-doped gain-media, ytterbium-doped gain-media, titanium-doped sapphire, chromium-doped forsterite, and chromium-doped zinc selenide. A plurality diode-lasers, provides optical pump-radiation for energizing the gain-element. A pump-radiation router is arranged to receive pump-radiation from the plurality of diode-lasers and to cause the pump-radiation to make repeated interactions with the slab through the first face thereof to form an elongated gain-region in the slab extending between the first and second ends thereof. An optical pulse being amplified propagates through the elongated gain-region in a length direction thereof between the first and second ends of the slab.

In embodiments of the inventive optical amplifier described hereinbelow, the pulse being amplified may propagate through the gain medium via one or grazing incidence reflections from the first or second faces of the gain element. Pump-radiation is provided by diode-lasers in a diode-laser bar (linear array). The pump radiation router includes a roof prism in combination with a pick up minor and lens, and repeatedly images the far-field of the diode-laser bar on the gain-element to provide the repeated interactions which create the elongated gain-region therein.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 4 is an end-elevation view schematically illustrating a preferred arrangement of the multi-pass router in the general arrangement of the face-pump slab amplifier of FIG. 1, with detail of the diode-laser bar package.

FIG. 4A is a plan view from above schematically illustrating further detail of the diode-laser bar package in the arrangement of FIG. 4.

DETAILED DESCRIPTION OF THE INVENTION

Figure 1:
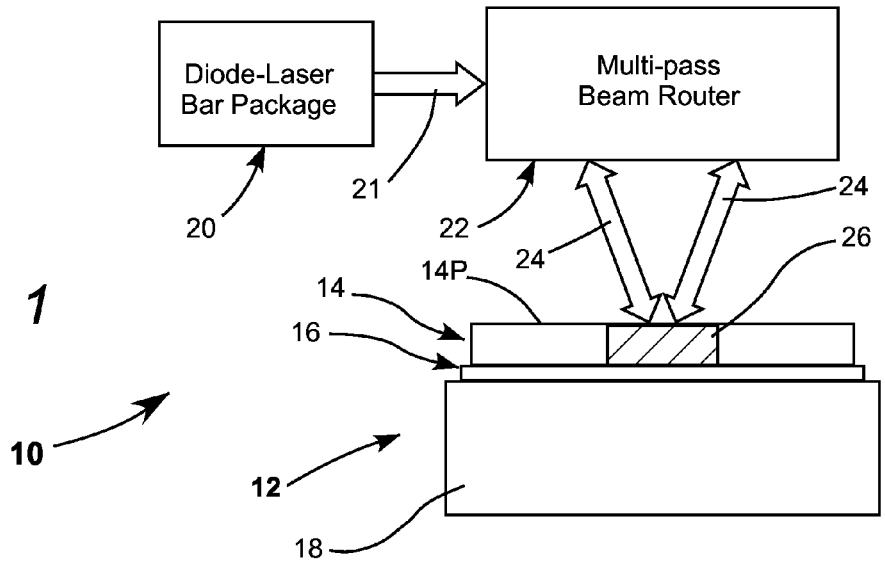
FIG. 1 schematically illustrates a preferred general layout of a face-pumped slab amplifier in accordance with the present invention including a gain-structure having a gain-medium in the form of a thin wafer of a doped solid-state gain-medium, a diode-laser bar delivering optical pump-radiation, and a multi-pass router for receiving radiation from the diode-laser bar and causing the radiation to make multiple incidences through a pump-input face of the wafer in an elongated pumped region of the gain-medium.
Figure 1A:
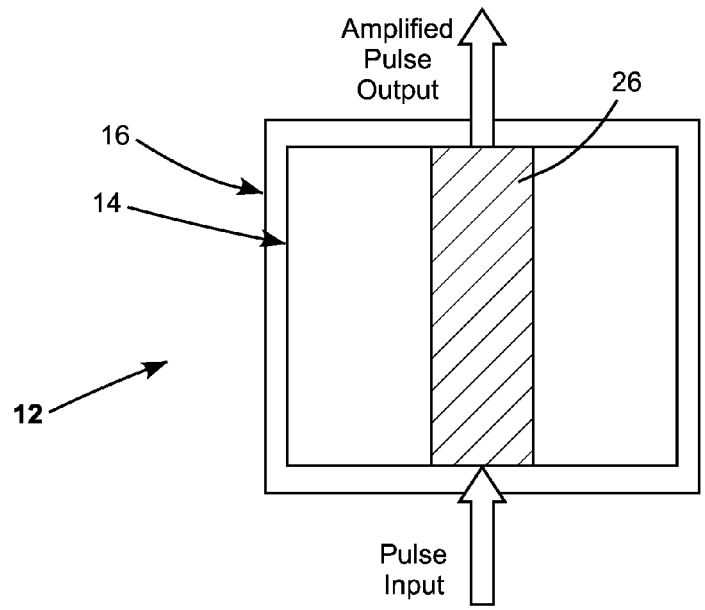
FIG. 1A is a plan view from above schematically illustrating details of the gain-medium and the elongated pumped region thereof in the amplifier of FIG. 1.

Referring now to the drawings, wherein like components are designated by like reference numerals, FIG. 1 schematically illustrates a preferred general layout of a face-pumped slab amplifier 10 in accordance with the present invention. Amplifier 10 includes a gain-structure 12 having a gain-element 14 in the form of a thin wafer of a doped solid-state gain-medium. A preferred gain-medium for amplifying ultra-short pulses, for example pulses having a duration of about 500 picoseconds (ps) or less, is ytterbium-doped yttrium aluminum garnet (Yb:YAG). Gain-element 12 is supported on a heat-sink 18 of a material such as copper (Cu) or a copper-tungsten alloy CuW. Interface layers 16 are provided between the heat-sink and the gain-element. These layers are discussed further herein below.

A diode-laser bar package 20 includes a diode-laser bar (not explicitly shown in FIG. 1). Radiation 21 from the diode-laser bar is received by a multi-pass router 22 which causes multiple incidences 24 (only two thereof shown in FIG. 1) on an elongated, optically pumped region 26 of gain-element 14, thereby providing optical gain in the pumped region. Input pulses to be amplified are directed through pumped region and exit the gain-element as amplified pulses. Pump radiation is directed through face 14P of the gain element.

Gain-element 14 preferably has a thickness between about 100 micrometers ($\mu m$) and 500 $\mu m$. Element 14 preferably has a length in the beam-throughput direction of between about 5 mm and 30 mm. Pumped region 26 preferably has a width between about 100 $\mu m$ and about 500 $\mu m$. Given these exemplary dimensions, the gain-element can be alternatively described as a "wafer" or a "chip", rather than a "slab".

Regarding gain-media for gain-element 14, the inventive amplifier is specifically configured for materials with relatively low-gain but with relatively broad-gain bandwidth, which usually also exhibit relatively high temperature dependence of refractive index. Yb-doped media include (in addition to above discussed Yb:YAG) ytterbium-doped potassium yttrium tungstate (Yb:KYW), ytterbium-doped potassium gadolinium tungstate (Yb:KGW), ytterbium-doped lutetium oxide (Yb:Lu$_2$O$_3$), ytterbium-doped lutetium scandium oxide (Yb:LuScO$_3$), ytterbium-doped potassium lutetium tungstate (Yb:KLuW), and ytterbium-doped calcium gadolinium aluminate Yb:CaGdAlO$_4$.

Other gain media for which the inventive amplifier is suitable include thulium (Tm) doped material, such as thulium-doped YAG (Tm:YAG) and thulium-doped yttrium lithium fluoride (Tm:YLF), and vibronic gain-materials including Ti:sapphire, chromium-doped forsterite (Cr:forsterite), and chromium-doped zinc selenide (Cr:ZnSe). The terms "relatively low gain" and "relatively broad bandwidth" as used in this description mean relative to materials such as neodymium-doped YAG (Nd:YAG) and neodymium-doped yttrium vanadate (Nd:YVO$_4$) for which the inventive amplifier is unsuitable.

Layers 16 optionally include a dielectric layer coated on the gain-element and having a lower refractive index than that of the gain-element. This is required for the grazing incidence reflection of the input radiation (total internal reflection—TIR) if grazing incidence reflection is involved in the passage of a beam through the gain-region. A preferred material for the layer is silicon dioxide (SiO$_2$) and this layer should have an optical thickness of at least one wavelength at the wavelength of the radiation being amplified. This layer is backed with a highly reflective (HR) coating such as a multilayer dielectric reflective coating for providing reflection for the pump radiation.

Throughout this description, the interface layers are designated by the reference numeral 16 for convenience of description. Those skilled in the art will recognize that there may be subtle differences in optically functional layers of the interface in different embodiments. These differences will be evident without detailed description or drawing, from the general description given above, and the particular optical arrangement of any particular embodiment.

In interface layers 16, the HR coating or any other optically functional layer, is backed by a metallization layer of a metal such as gold (Au), titanium (Ti), platinum (Pt), nickel (Ni,) or Cu. The gain-element and the coatings thereon can then be bonded to the heat-sink using a solder such as gold-tin (AuSn), silver-tin (AgSn), or indium (In). If a highly reflecting metal such as gold is used for metallization, the number of layers in the multilayer dielectric reflector can be significantly reduced to improve heat transfer from the gain-element to the heat-sink.

Figure 2:
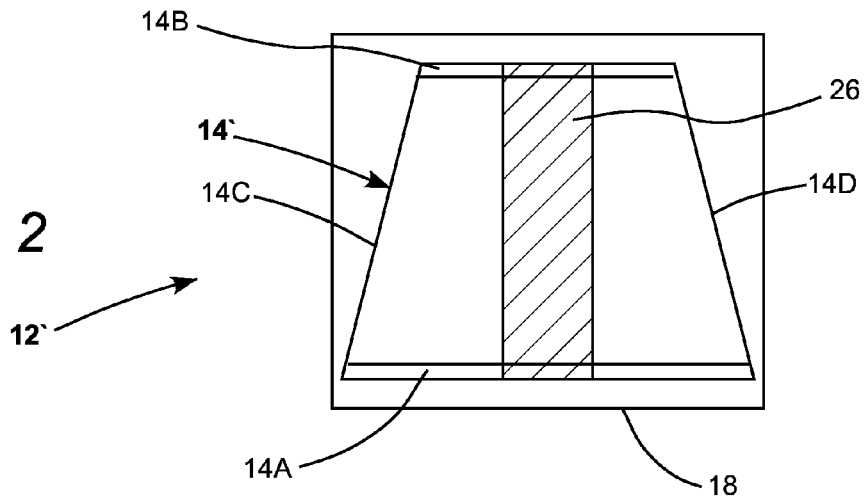
FIG. 2 is a plan view from above schematically illustrating an alternate from of the gain-element of FIG. 1, including non-parallel sides and end-faces for preventing parasitic oscillation.

FIG. 2 schematically illustrates an alternate form 14' of the gain-element of FIG. 1. This alternate form has sides 14C and 14D of the gain-element cut non-parallel to each other to avoid parasitic lateral oscillation, and end faces 14A and 14B cut non-parallel to each other for minimizing the possibility of parasitic longitudinal oscillation.

Figure 2A:
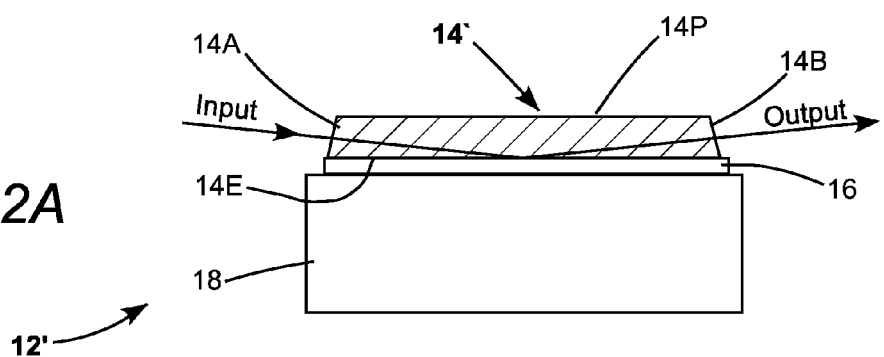
FIG. 2A is an elevation view schematically illustrating a gain-structure including single-pass grazing-incidence arrangement through the gain-element of FIG. 2 for a beam being amplified, with the grazing incidence opposite the pump-input face.

FIG. 2A schematically illustrates a gain-structure 12' including a single-pass, grazing-incidence arrangement through the gain-element, designated element 14'. Here, an input beam enters face 14A at an angle of incidence about at or near normal incidence thereto; makes a grazing incidence reflection from base 14E of the gain-element; and exits as amplified output via face 14B about at or near normal incidence thereto. Pump radiation is incident through face 14P as described above.

Figure 2B:
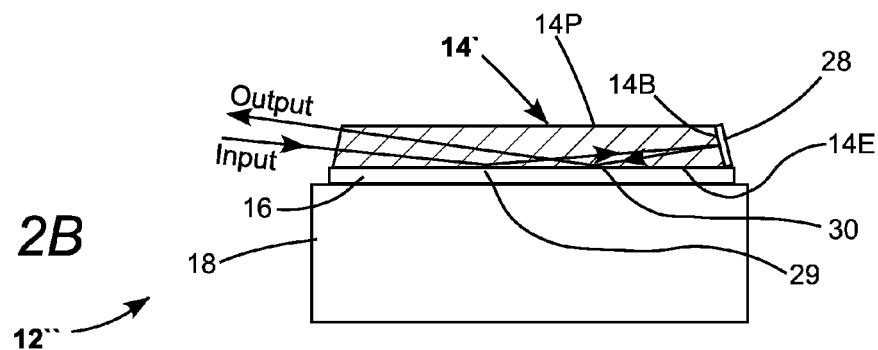
FIG. 2B is an elevation view schematically illustrating a gain-structure including a double-pass grazing-incidence arrangement through the gain-element of FIG. 2 for a beam being amplified, with the grazing incidences opposite the pump-input face.

FIG. 2B schematically illustrates gain-structure 12" including a double-pass grazing-incidence arrangement through gain-element 14'. Here, an input beam enters face 14A at an angle of incidence about at or near normal incidence thereto; makes a first grazing incidence reflection from base 14E of the gain-element at a point 29 thereon; is reflected from a reflective coating 28 deposited on face 14B of the gain-element; makes a second grazing incidence reflection from base 14E of the gain-element at a point 30 thereon, spaced apart from point 29; and exits as amplified output via face 14A about at or near normal incidence thereto.

Figure 2C:
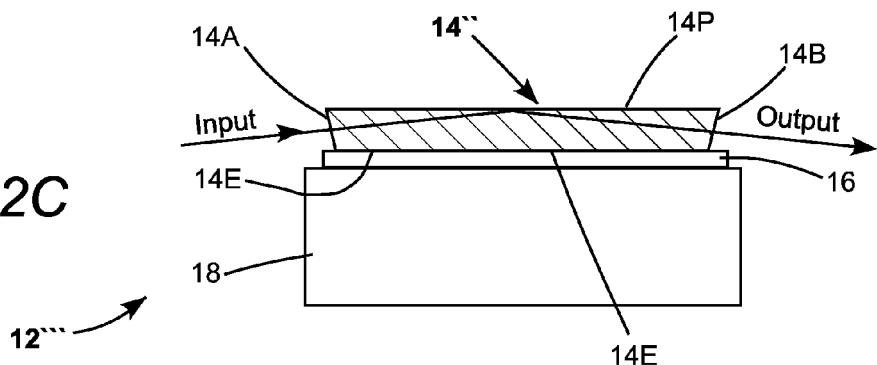
FIG. 2C is an elevation view schematically illustrating a gain-structure including single-pass grazing-incidence arrangement through the gain-element of FIG. 2 for a beam being amplified, with the grazing incidence on the pump-input face.

FIG. 2C schematically illustrates a gain-structure 12''' similar to gain-structure 12' of FIG. 2A but wherein the grazing-incidence reflection occurs from the pump-input face 14P of the gain-element. Gain element 14" in this arrangement is essentially gain element 14A of FIG. 2A "flipped over". For consistency, however, the face of element 14" through which pump radiation is designated 14P.

Figure 2D:
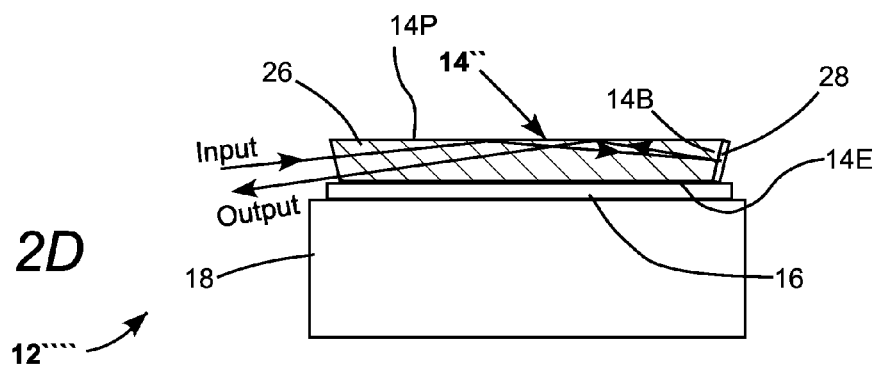
FIG. 2D is an elevation view schematically illustrating a gain-structure including a double-pass grazing-incidence arrangement through the gain-element of FIG. 2 for a beam being amplified, with the grazing incidences on the pump-input face.
Figure 2E:
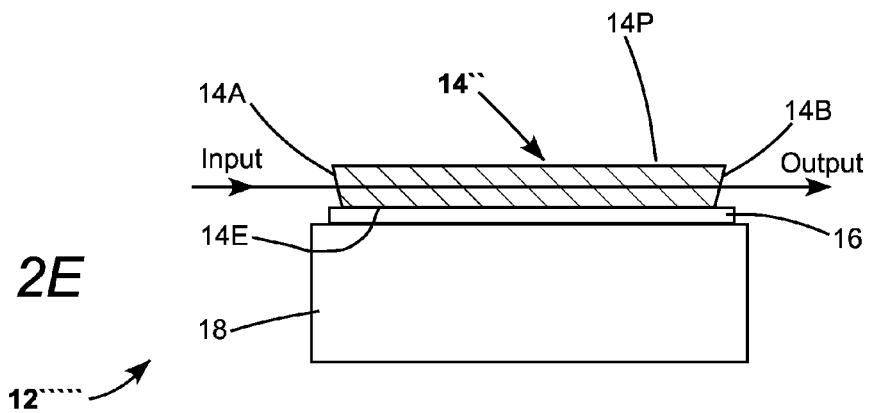
FIG. 2E is an elevation view schematically illustrating a gain from one end-face to the opposite end-face.

FIG. 2D schematically illustrates a gain-structure 12'''' similar to gain-structure 12" of FIG. 2B but wherein the spaced apart grazing-incidence reflections occur from the pump-input face 14P. FIG. 2E schematically illustrates a gain-structure 12''''' wherein a beam to be amplified propagates through gain-region 26 of the gain-element directly from one end-face (14A) of the gain element to the opposite end-face (14B) of the gain element.

Figure 3A:
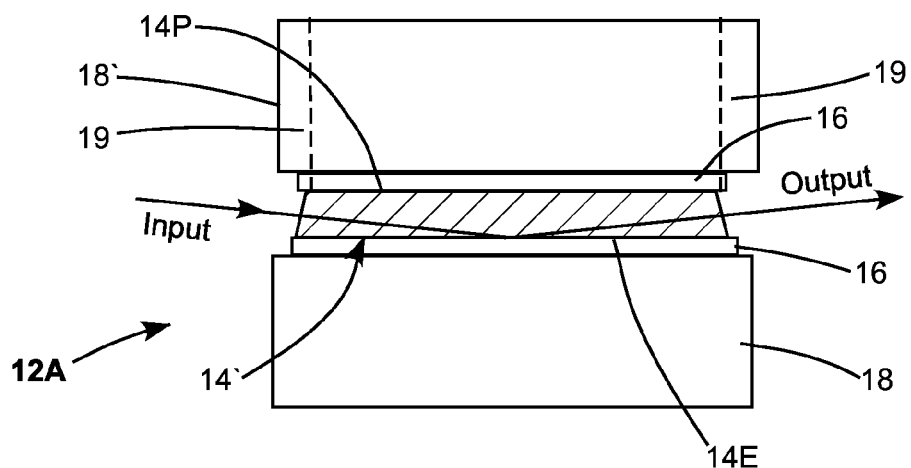
FIG. 3A is an elevation view schematically illustrating a gain-structure similar to the gain-structure of FIG. 2A, but including an additional heat-sink on the gain-element.

FIG. 3A schematically illustrates a gain-structure 12A similar to gain-structure 12' of FIG. 2A but including an additional heat-sink 18' on the surface of the gain-element through which pump-radiation is delivered. An elongated slot, indicated by dashed lines 19 is provided through heat-sink 18' to allow passage of pump-radiation. Interface layers 16 between the additional heat sink and the gain-element here are provided only to facilitate solder bonding of the additional heat-sink to the gain-element do not include any layers for providing TIR or pump-radiation reflection, and in fact are removed in the region of slot 19.

Figure 3B:
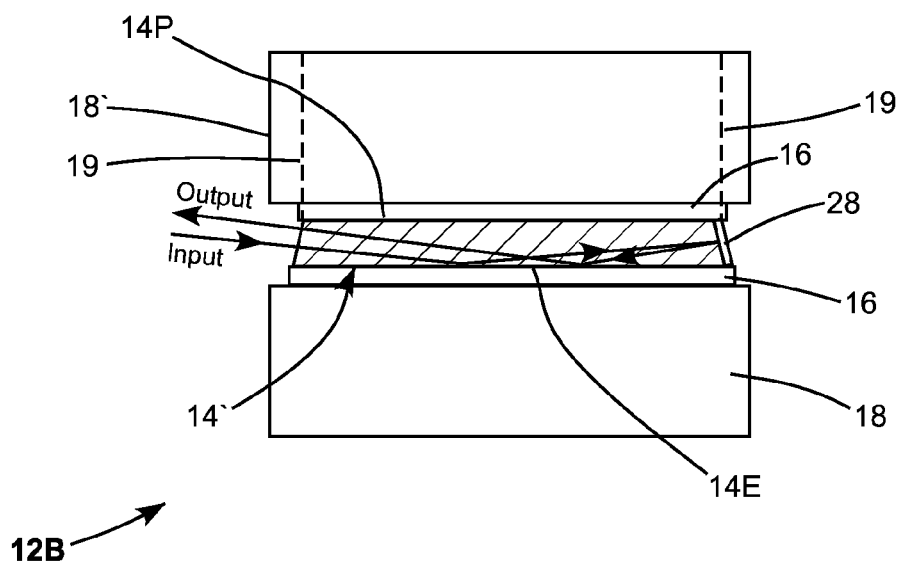
FIG. 3B is an elevation view schematically illustrating a gain-structure similar to the gain-structure of FIG. 2B but including an additional heat-sink on the gain-element.

FIG. 3B schematically illustrates a gain-structure 12B similar to gain-structure 12" of FIG. 2A, and here again including an additional heat-sink 18' on the surface of the gain-element through which pump-radiation is delivered. The elongated slot, indicated by dashed lines 19 is provided through heat-sink 18' to allow passage of pump-radiation as in gain-structure 12A.

FIG. 4 and FIG. 4A schematically illustrate one preferred arrangement 10A of the multi-pass router and diode-laser bar package in the general arrangement of the face-pump slab amplifier of FIG. 1. A diode-laser bar package 20A includes a linear array of diode-lasers (emitters) 40 (see FIG. 4A) in a common substrate 42 (the diode-laser "bar"). Diode-laser bar 42 is supported on a heat sink 44, which may be actively cooled. Each diode-laser 40 emits a corresponding beam 48 of radiation. The beams are collimated in a fast (high-divergence) axis of the diode-laser bars by a fast-axis collimating (FAC) lens 46. Multi-pass router 22A includes a 90° roof-prism 50, a pick-up mirror 52 and a focusing lens 56. Optical axis 58 of lens 56 is displaced from the apex 54 of the roof-prism by a distance D. Pick-up mirror 52, offset from the apex of the roof prism receives overlapping fast-axis collimated beams 48 from the diode-lasers (diode-laser bar) in the far-field of the diode-laser bar and directs the beams into the roof-prism.

The offset of the pick-up mirror and the distance D, are preferably selected such that the beams (aligned in the slow axis thereof) make multiple passes (here, three) in and out of the prism, being focused on gain-element 14, then re-collimated each time by lens 56, with an intermediate pass being along the optical axis of the lens. These passes are indicated in FIG. 4 by solid arrowheads. The beams then return along the original paths (indicated by open arrowheads), making further interactions with gain-element 14. This can be considered as the lens repeatedly imaging the far-field of the beams on the gain-element. On mirror 52 the individual beams merge into what is effectively a combined beam, designated by dashed line 49, which is what is multiply imaged on the gain-element.

The multiple interactions (and the linear form of the focused beams) provide the elongated linear pumped region 26 on gain-element 14. The length of the pumped region is aligned with the slow axis of the diode-laser beams, and the width of the pumped region is in the fast-axis direction of the diode-laser beams. This is important for providing tight-focus and high-intensity of the beam in the pumped region, the fast-axis being the axis of highest brightness. The total power in the beams and the number of interactions of the beams with the gain-element can be selected, corresponding with the pump-radiation absorption coefficient of the gain-element, such that essentially all of the beam-power is absorbed in region 26 after the final interaction (incidence).

Those skilled in the art will recognize that if more pump-power is required than can be delivered by a single array of diode-lasers (diode-laser bar), then one or more additional arrays diode-laser bars may be used. Such arrangements include one or more diode-laser bars emitting at the same wavelength in a two-dimensional array stacked in the fast-axis direction; two separate diode-laser bars emitting at the same wavelength but with outputs combined by polarization rotation and combination along a common path to the router; and two separate diode-laser bars emitting different wavelengths but with outputs combined by a dichroic combiner a common path to the router.

Figure 4B:
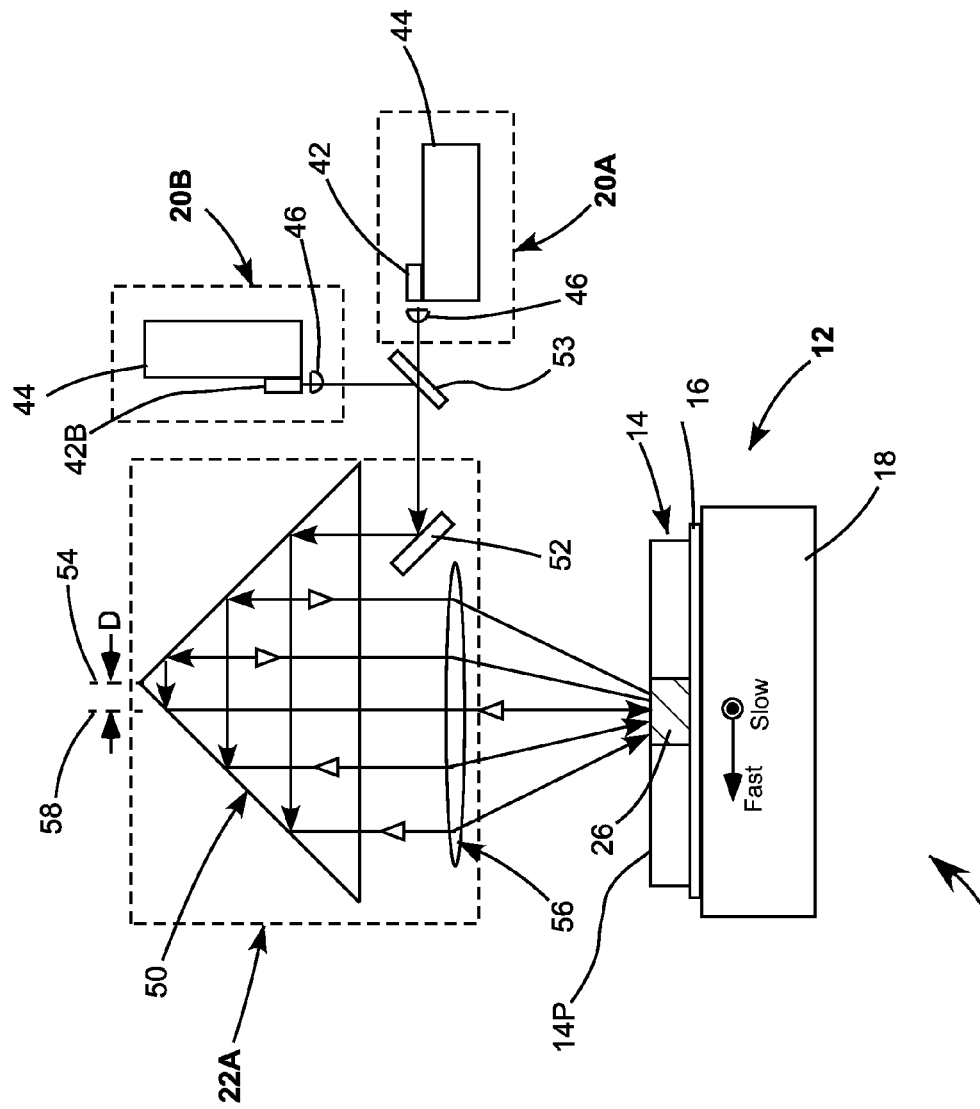
FIG. 4B is an end-elevation view schematically illustrating another preferred arrangement of the multi-pass router in the general arrangement of the face-pump slab amplifier of FIG. 1, similar to the embodiment of FIG. 4 but wherein power pump radiation is supplied to the multi-pass router from first and second diode-laser bar packages delivering pump-radiation at first and second different wavelengths.

By way of example, FIG. 4B schematically illustrates another preferred arrangement 10B of the multi-pass router and diode-laser bar package in the general arrangement of the face-pump slab amplifier of FIG. 1. Arrangement 10B is similar to the arrangement of FIG. 4 but includes a second diode-laser bar package 20B. Diode-laser bar package 20B includes a diode-laser bar 42B which emits radiation at a wavelength different from that of emitted by diode-laser bar 42. For Yb-doped media diode-laser bar 42 could emit radiation at a wavelength of about 976 nm and diode-laser bar 42B could emit radiation at a wavelength of about 915 nm. The beams from each diode laser bar package are combined by a dichroic beam-combiner 53 along a common path to pick-up mirror 52.

Figure 5:
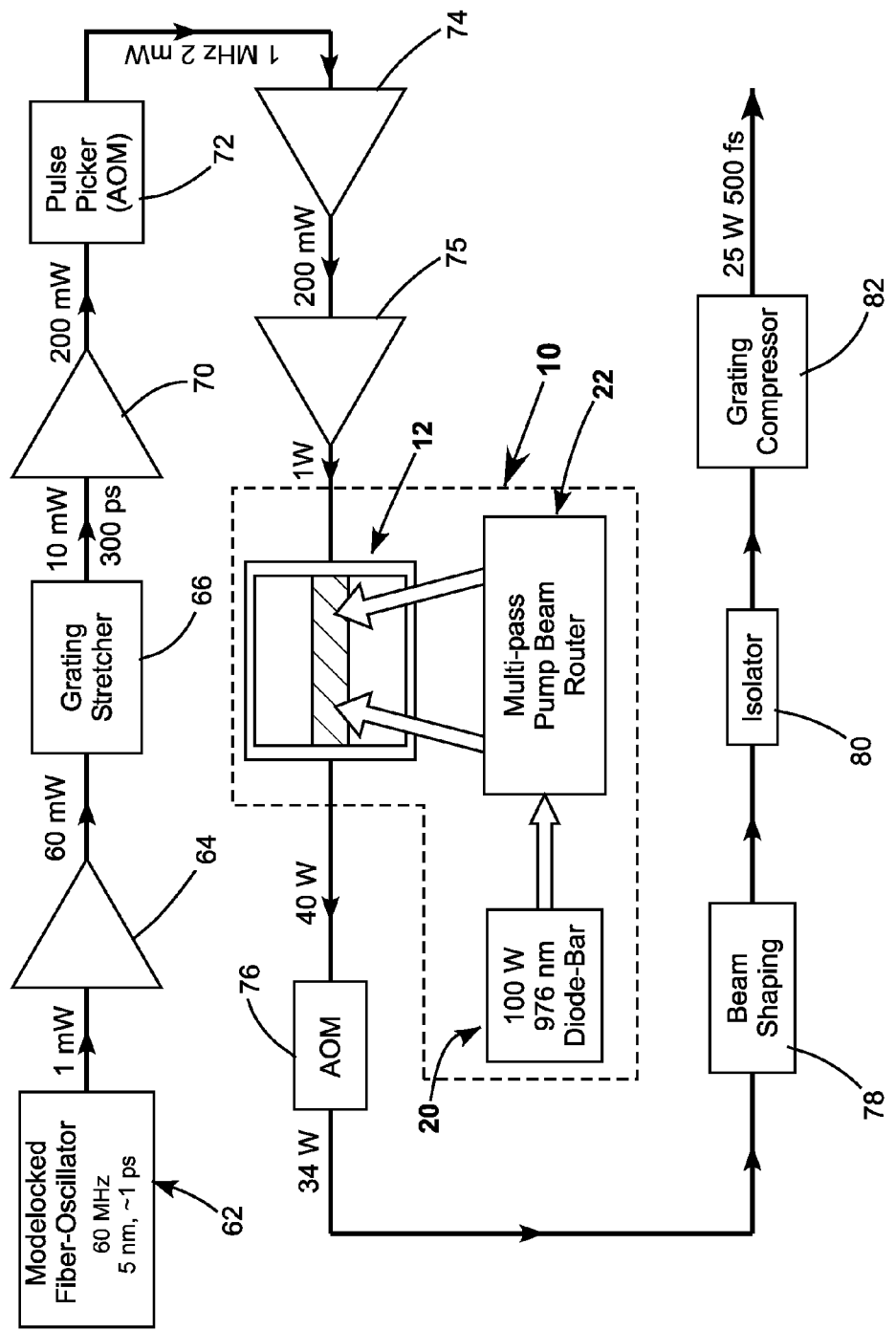
FIG. 5 is a block-diagram schematically illustrating one preferred embodiment of a pulsed fiber-MOPA including a face-pumped slab amplifier in accordance with the present invention.

FIG. 5 schematically illustrates a preferred embodiment 60 of a fiber-MOPA including a face-pumped slab amplifier 10 in accordance with the present invention. The face-pumped amplifier is represented in the general form of FIG. 1 for convenience of illustration. MOPA 60 is described as being seeded by a mode-locked, Yb-doped, fiber-oscillator (laser) 62 delivering a train of pulses, each thereof having a duration of about 300 fs, with a spectral bandwidth of about 7 nm, at a pulse-repetition frequency (PRF) of 60 MHz. The average power in the train of mode-locked pulses is assumed to be about 1 milliwatt (mW).

Pulses from oscillator 62 are pre-amplified by a first conventional Yb-doped fiber-amplifier 64. As pumping arrangements for conventional fiber-amplifiers are well known in the art, such arrangements are not described and depicted for amplifier 64 and all other conventional amplifiers in MOPA 60, for simplicity of illustration. Following amplification in amplifier 64, the train of mode-locked pulses has an average power of about 60 mW.

The pulse-train next passes through a grating-based pulse-stretcher 66, which increases the duration of individual pulses in the train to about 300 ps. The average power in the pulse-train is reduced, due to losses in the pulse-stretcher, to about 10 mW. Pulses from oscillator 62 are further pre-amplified by a second conventional Yb-doped fiber-amplifier 70. This amplifier increases the average power in the pulse-train to about 200 mW.

The pulse-train from amplifier 70 is passed through an acousto-optic modulator (AOM) 72. AOM 72 serves as a pulse-picker and, here, passes every $60^{th}$ pulse in the input train thereof to provide an output PRF of 1 MHz. As a result of the pulse-picking, and less than 100% efficiency of the AOM, the average power in the 1 MHz pulse-train is reduced to about 2 mW. This pulse-train is amplified in a third conventional Yb-doped fiber-amplifier 74. This increases the average power in the pulse-train to about 200 mW. A fourth conventional Yb-doped fiber-amplifier 75 increases the average power in the pulse-train to about 1 W for delivery to the inventive faced-pumped slab (wafer) amplifier 10.

In this example, amplifier 10 is pumped by a diode-laser bar 20 delivering continuous wave (CW) radiation at a wavelength of about 976 nm with a total power of about 100 Watts (W). Amplifier 10 delivers a pulse-train having an average power of 40 W.

The output pulse-train from amplifier 10 is passed through a second AOM 76 for further pulse-picking or for attenuation to control output power of the MOPA. The pulse-train from the AOM 76 has a maximum average power of about 34 W. This pulse-train is processed by beam-shaping optics 78 to generate a round beam-profile then passed through an optical isolator 80 to a grating-based pulse-compressor 82. Pulse-compressor 82 reduces the pulse duration of pulses in the train thereof to about 500 fs. The average power in the train of compressed pulses is reduced to about 25 W due to less than 100% efficiency of the pulse-compressor.

Those skilled in the art to which the present invention pertains will recognize that MOPA 60 is but one, relatively complex, MOPA arrangement in which the inventive face-pumped amplifier can be deployed and may construct others, more complex or simpler, without departing from the spirit and scope of the present invention. By way of example, in MOPA 60 pulse stretching is performed to reduce peak-pulse power in fiber amplifier stages 70 and 74, for avoiding degradation of pulses and loss of gain due to nonlinear effects in the amplifier fibers. At lower powers, this pulse-stretching and subsequent compression may be omitted. The inventive face-pumped amplifier is specifically configured for relatively low-gain, relatively broad bandwidth, thermally sensitive gain-media, such as the exemplified Yb-doped gain-media discussed above. Those skilled in the art will also recognize that the inventive amplifier may be included in a resonant (feedback) cavity to provide an effective oscillator, or to provide for regenerative amplification.

In summary, the present invention is described above with reference to a preferred and other embodiments. The invention, however, is not limited to the embodiments described and depicted. Rather, the invention is limited only by the claims appended hereto.

What is claimed is:

1. An optical amplifier for amplifying optical pulses, comprising:
   a gain-element in the form of a slab of a solid-state gain-medium having first and second opposite faces, first and second opposite ends, and first and second opposite sides, the gain-medium being selected from a group of gain-media consisting of thulium-doped gain-media, ytterbium-doped gain-media, titanium-doped sapphire, chromium-doped forsterite, and chromium-doped zinc selenide;
   a plurality diode-lasers, providing optical pump-radiation for energizing the gain-element;
   a reflective layer located adjacent the second face of the slab, said layer being reflective to the optical pump radiation;
   a pump-radiation router including a reflector spaced from the slab and arranged to receive pump-radiation from the plurality of diode-lasers, and to cause the pump-radiation to make repeated passes through the slab, entering the first face thereof and being reflected back into the slab by the reflective layer and passing out through the first face to be reflected back into the slab by the reflector, the repeated passes forming an elongated gain-region in the slab extending between the first and second ends thereof; and
   wherein an optical pulse being amplified propagates through the elongated gain-region in a length direction thereof between the first and second ends of the slab.

2. The amplifier of claim 1, wherein the optical pulse being amplified propagates directly through the elongated gain-region, without being incident on the first and second faces of the gain element.

3. The amplifier of claim 1, wherein the optical pulse being amplified enters the elongated gain-region through the first end of the slab and makes at least one grazing-incidence reflection in the elongated gain region from the second face of the slab.

4. The amplifier of claim 3, wherein the pulse being amplified, after making the at least one grazing incidence reflection, exits the elongated gain-region via the second end of the slab as an amplified pulse.

5. The amplifier of claim 3, wherein the pulse being amplified after making the at least one grazing incidence reflection is reflected from the second end of the slab and makes a second grazing-incidence reflection in the elongated gain-region from the second face of the slab before exiting the elongated gain-region via the first end of the slab as an amplified pulse.

6. The amplifier of claim 1, wherein the optical pulse being amplified enters the elongated gain-region through the first end of the slab and makes at least one grazing-incidence reflection in the elongated gain region from the first face of the slab.

7. The amplifier of claim 6, wherein the pulse being amplified, after making the at least one grazing incidence reflection, exits the elongated gain-region via the second end of the slab as an amplified pulse.

8. The amplifier of claim 6, wherein the pulse being amplified after making the at least one grazing incidence reflection is reflected from the second end of the slab and makes a second grazing-incidence reflection in the elongated gain-region from the first face of the slab before exiting the elongated gain-region via the first end of the slab as an amplified pulse.

9. The amplifier of claim 1, wherein the slab has a thickness between about 100 micrometers and about 500 micrometers, and wherein the elongated gain-region has a length between about 5 mm and about 30 mm, and a width between about 100 micrometers and 500 micrometers.

10. An optical amplifier for amplifying optical pulses, comprising:
a gain-element in the form of a slab of a solid-state gain-medium having first and second opposite faces, first and second opposite ends, and first and second opposite sides, the gain-medium being selected from a group of gain-media consisting of thulium-doped gain-media, ytterbium-doped gain-media, titanium-doped sapphire, chromium-doped forsterite, and chromium-doped zinc selenide;
a plurality diode-lasers, providing optical pump-radiation for energizing the gain-element:
a pump-radiation router arranged to receive pump-radiation from the plurality of diode-lasers and to cause the pump-radiation to make repeated interactions with the slab through the first face thereof to form an elongated gain-region in the slab extending between the first and second ends thereof; and
wherein an optical pulse being amplified propagates through the elongated gain-region in a length direction thereof between the first and second ends of the slab and wherein the pump-radiation router includes a pick-up mirror and a focusing lens, and a roof-prism having first and second opposite reflecting faces inclined to each other and forming an apex, and a transmitting face opposite the apex, and wherein the pick-up minor receives a beam of pump-radiation from the diode-lasers and directs the pump-radiation beam into the roof prism through the transmitting face thereof, with the roof-prism, the pick-up mirror and the focusing lens being cooperatively arranged with respect to the slab such that the pump-radiation beam is reflected from both reflecting faces of the roof-prism, exits the transmitting face of the roof-prism along a first path, is focused by the lens onto the slab, is reflected from the second face of the slab back into the roof-prism through the transmitting face thereof, is reflected again from the reflecting faces of the roof-prism exits the transmitting face of the roof prism along a second path spaced apart from but parallel to the first path and is again focused by the lens onto the slab.

11. An optical amplifier for amplifying optical pulses, comprising:
a gain-element in the form of a slab of a solid-state gain-medium having first and second opposite faces, first and second opposite ends, and first and second opposite sides, the gain-medium being selected from a group of gain-media consisting of thulium-doped gain-media, ytterbium-doped gain-media, titanium-doped sapphire, chromium-doped forsterite, and chromium-doped zinc selenide;
a plurality diode-lasers, providing optical pump-radiation for energizing the gain-element:
a pump-radiation router arranged to receive pump-radiation from the plurality of diode-lasers and to cause the pump-radiation to make repeated interactions with the slab through the first face thereof to form an elongated gain-region in the slab extending between the first and second ends thereof; and
wherein an optical pulse being amplified propagates through the elongated gain-region in a length direction thereof between the first and second ends of the slab and wherein the plurality of diode-lasers each emit a beam having a transverse slow-axis and a transverse fast-axis perpendicular to the slow-axis, and the diode-lasers are in a linear array with slow-axes thereof aligned with each other, and wherein the diode-laser beams overlap and combine to form the pump-radiation beam having corresponding fast and slow axes.

12. The amplifier of claim 11, wherein the length of the elongated gain-region is in the slow-axis direction of the pump-radiation beam, and the width of the elongated gain-region is in the fast-axis direction of the diode-laser beam.

13. The amplifier of claim 1, wherein the gain-medium is one of Yb-doped yttrium aluminum garnet include, ytterbium-doped potassium yttrium tungstate, ytterbium-doped potassium gadolinium tungstate, ytterbium-doped lutetium oxide, ytterbium-doped lutetium scandium oxide, ytterbium-doped potassium lutetium tungstate, and ytterbium-doped calcium gadolinium aluminate.

14. An optical amplifier for amplifying optical pulses, comprising:
a gain-element in the form of a slab of a solid-state gain-medium having first and second opposite faces, first and second opposite ends, and first and second opposite sides, the gain-medium being selected from a group of gain-media consisting of thulium-doped gain-media, ytterbium-doped gain-media, titanium-doped sapphire, chromium-doped forsterite, and chromium-doped zinc selenide;
a diode-laser bar including a plurality of diode-laser emitters each thereof characterized as having a fast-axis and a slow axis perpendicular to the fast-axis with the slow-axes thereof aligned with each other, the diode-laser bar providing an optical pump-radiation beam for energizing the gain-element, the pump-radiation beam having fast- and slow-transverse axes corresponding to the fast- and slow-exes of the diode-laser emitters;
a pump-radiation router arranged to receive pump-radiation beam from the plurality of diode-lasers and to cause the pump-radiation to make repeated interactions with the slab through the first face thereof to form an elongated gain-region in the slab extending between the first and second ends thereof, the elongated gain region having length in the slow-axis direction of the pump-radiation beam and a width in the fast-axis direction of the pump-radiation beam; and
wherein an optical pulse being amplified propagates through the elongated gain-region in a length direction thereof between the first and second ends of the slab.

15. The amplifier of claim 14, wherein the optical pulse being amplified propagates directly through the elongated gain-region, without being incident on the first and second faces of the gain element.

16. The amplifier of claim 14, wherein the optical pulse being amplified enters the elongated gain-region through the first end of the slab and makes at least one grazing-incidence reflection in the elongated gain region from the second face of the slab.

17. The amplifier of claim 16, wherein the pulse being amplified, after making the at least one grazing incidence reflection, exits the elongated gain-region via the second end of the slab as an amplified pulse.

18. The amplifier of claim 16, wherein the pulse being amplified after making the at least one grazing incidence reflection is reflected from the second end of the slab and makes a second grazing-incidence reflection in the elongated gain-region from the second face of the slab before exiting the elongated gain-region via the first end of the slab as an amplified pulse.

19. Optical apparatus, comprising:
- a laser providing a seed pulse having a wavelength within the gain bandwidth of ytterbium-doped gain-fibers;
- at least one optical fiber-amplifier including an ytterbium-doped gain-fiber for amplifying the seed pulse;
- an optical power-amplifier for further amplifying the amplified seed-pulse, the power-amplifier including a gain-element in the form of a slab of an ytterbium-doped solid-state gain-medium having first and second opposite faces, first and second opposite ends, and first and second opposite sides a pump-radiation router arranged to receive a pump-radiation beam from the plurality of diode-lasers, and to cause the pump-radiation beam to make repeated interactions with the slab through the first face thereof to form an elongated gain-region in the slab extending between the first and second ends thereof; and
- wherein, the amplified pulse being further amplified propagates through the elongated gain-region in a length direction thereof between the first and second ends of the slab and wherein the plurality of diode-lasers are emitters of a diode-laser bar, each diode-laser emitter characterized as having a fast-axis and a slow axis perpendicular to the fast-axis, with the slow-axes of the emitters aligned with each other, the pump-radiation beam having fast- and slow-transverse axes corresponding to the fast- and slow-axes of the diode-laser emitters, and wherein the elongated gain region has a length in the slow-axis direction of the pump-radiation beam and a width in the fast-axis direction of the pump-radiation beam.

* * * * *